US012616059B2

(12) United States Patent
Tremlett et al.

(10) Patent No.: US 12,616,059 B2
(45) Date of Patent: Apr. 28, 2026

(54) ELECTRONIC DEVICE PACKAGE INCLUDING A GEL

(71) Applicant: Microchip Technology Caldicot Limited, Caldicot (GB)

(72) Inventors: Piers Tremlett, Coleford (GB); Dan Chenery, Newport (GB); Stylianos Syrigos, Newport (GB)

(73) Assignee: Microchip Technology Caldicot Limited, Caldicot (GB)

( * ) Notice: Subject to any disclaimer, the term of this patent is extended or adjusted under 35 U.S.C. 154(b) by 648 days.

(21) Appl. No.: 17/962,629

(22) Filed: Oct. 10, 2022

(65) Prior Publication Data

US 2024/0071851 A1 Feb. 29, 2024

Related U.S. Application Data

(60) Provisional application No. 63/400,431, filed on Aug. 24, 2022.

(51) Int. Cl.
H01L 25/065 (2023.01)
H01L 21/48 (2006.01)
(Continued)

(52) U.S. Cl.
CPC ........ H01L 23/296 (2013.01); H01L 21/4839 (2013.01); H01L 21/4842 (2013.01); H01L 21/4875 (2013.01); H01L 21/56 (2013.01); H01L 23/3121 (2013.01); H01L 23/49838 (2013.01); H01L 23/49861 (2013.01);
(Continued)

(58) Field of Classification Search
CPC ............. H01L 21/4839; H01L 21/4842; H01L 21/4875; H01L 21/56; H01L 23/296; H01L 23/3121; H01L 23/49838; H01L 23/49861; H01L 23/057; H01L 23/3735; H01L 23/49531; H01L 23/49562; H01L 23/49575; H01L 23/49811; H01L 23/24; H01L 24/48; H01L 25/0655; H02M 7/003
See application file for complete search history.

(56) References Cited

U.S. PATENT DOCUMENTS 5,767,447 A * 6/1998 Dudderar ................ H01L 23/24
257/E23.189
5,804,468 A 9/1998 Tsuji et al. .................... 438/122
(Continued)

FOREIGN PATENT DOCUMENTS

EP 3249684 A1 11/2017 ............. H01L 23/04
GB 2380613 A 4/2003 ........... H01L 23/057

OTHER PUBLICATIONS

International Search Report and Written Opinion, Application No. PCT/EP2023/054757, 15 pages.

*Primary Examiner* — Omar F Mojaddedi
(74) *Attorney, Agent, or Firm* — SLAYDEN GRUBERT BEARD PLLC

(57) ABSTRACT

An electronic device package includes a frame, an electronic device mounted to the frame, surface-mount leads, and a gel at least partially filling a cavity between the electronic device and the frame. The electronic device includes electronic circuitry provided on an electronic device substrate, and the surface-mount leads are electrically connected to the electronic circuitry and extend laterally and outwardly from an outer perimeter of the frame. The gel in the cavity covers the electronic circuitry.

17 Claims, 15 Drawing Sheets

(51) Int. Cl.

| | | |
|---|---|---|
| *H01L 21/56* | (2006.01) | |
| *H01L 23/29* | (2006.01) | |
| *H01L 23/31* | (2006.01) | |
| *H01L 23/498* | (2006.01) | |
| *H01L 23/00* | (2006.01) | |

(52) U.S. Cl.

CPC .......... *H01L 25/0655* (2013.01); *H01L 24/48* (2013.01); *H01L 2224/48011* (2013.01); *H01L 2224/48095* (2013.01); *H01L 2224/48155* (2013.01); *H01L 2924/1616* (2013.01); *H01L 2924/16251* (2013.01); *H01L 2924/16315* (2013.01); *H01L 2924/17151* (2013.01); *H01L 2924/172* (2013.01); *H01L 2924/173* (2013.01); *H01L 2924/1815* (2013.01); *H01L 2924/182* (2013.01); *H01L 2924/186* (2013.01)

(56) References Cited

U.S. PATENT DOCUMENTS

| | | | |
|---|---|---|---|
| 6,521,983 B1 * | 2/2003 | Yoshimatsu | .......... H01L 25/072 |
| | | | 257/E25.031 |
| 2017/0339798 A1 * | 11/2017 | Wang | ...................... H01L 23/04 |
| 2020/0091910 A1 * | 3/2020 | Hiratsuka | .............. G01R 31/26 |
| 2021/0175149 A1 | 6/2021 | Gaulin et al. | |
| 2022/0051963 A1 | 2/2022 | England et al. | |

* cited by examiner

GEL TOP SURFACE

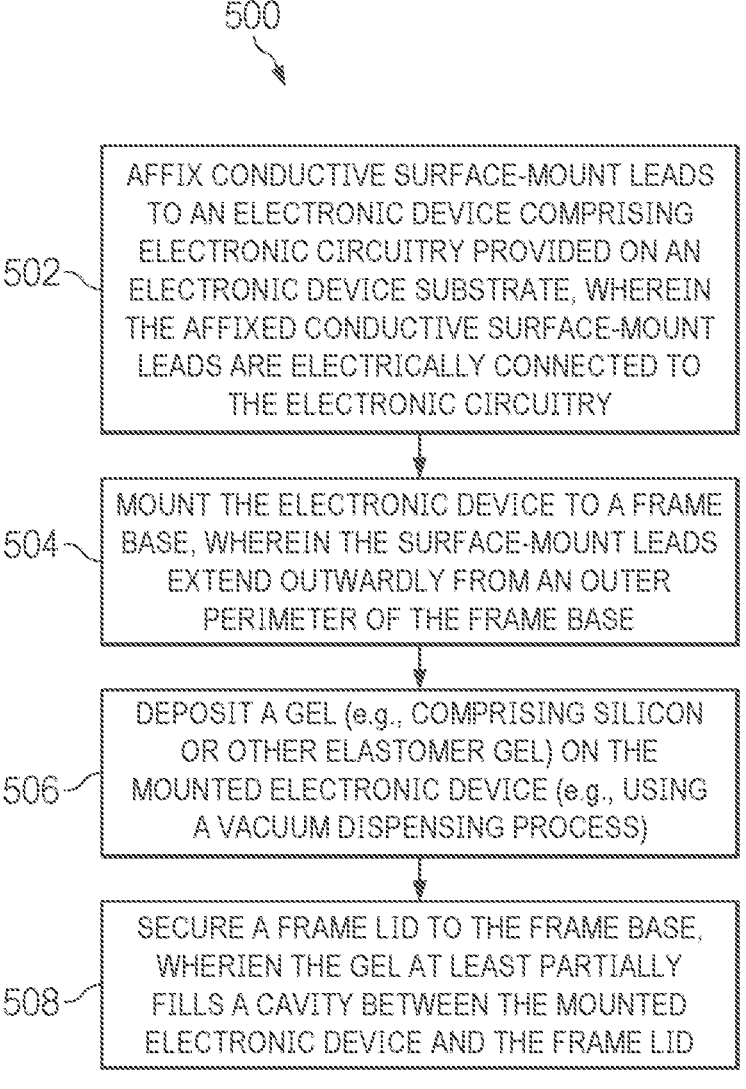

500

502 — AFFIX CONDUCTIVE SURFACE-MOUNT LEADS TO AN ELECTRONIC DEVICE COMPRISING ELECTRONIC CIRCUITRY PROVIDED ON AN ELECTRONIC DEVICE SUBSTRATE, WHEREIN THE AFFIXED CONDUCTIVE SURFACE-MOUNT LEADS ARE ELECTRICALLY CONNECTED TO THE ELECTRONIC CIRCUITRY

504 — MOUNT THE ELECTRONIC DEVICE TO A FRAME BASE, WHEREIN THE SURFACE-MOUNT LEADS EXTEND OUTWARDLY FROM AN OUTER PERIMETER OF THE FRAME BASE

506 — DEPOSIT A GEL (e.g., COMPRISING SILICON OR OTHER ELASTOMER GEL) ON THE MOUNTED ELECTRONIC DEVICE (e.g., USING A VACUUM DISPENSING PROCESS)

508 — SECURE A FRAME LID TO THE FRAME BASE, WHERIEN THE GEL AT LEAST PARTIALLY FILLS A CAVITY BETWEEN THE MOUNTED ELECTRONIC DEVICE AND THE FRAME LID

FIG. 5

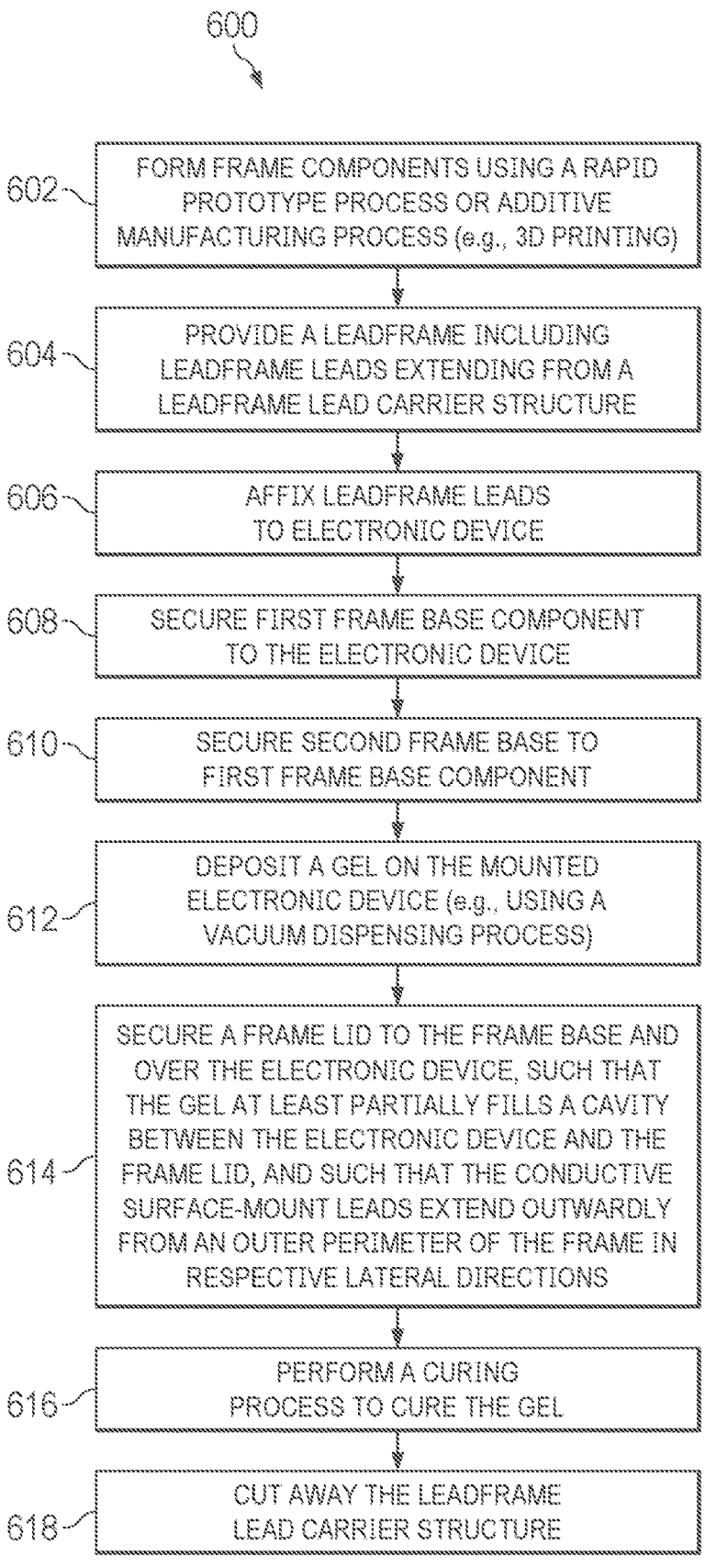

600

| 602 | FORM FRAME COMPONENTS USING A RAPID PROTOTYPE PROCESS OR ADDITIVE MANUFACTURING PROCESS (e.g., 3D PRINTING) |

| 604 | PROVIDE A LEADFRAME INCLUDING LEADFRAME LEADS EXTENDING FROM A LEADFRAME LEAD CARRIER STRUCTURE |

| 606 | AFFIX LEADFRAME LEADS TO ELECTRONIC DEVICE |

| 608 | SECURE FIRST FRAME BASE COMPONENT TO THE ELECTRONIC DEVICE |

| 610 | SECURE SECOND FRAME BASE TO FIRST FRAME BASE COMPONENT |

| 612 | DEPOSIT A GEL ON THE MOUNTED ELECTRONIC DEVICE (e.g., USING A VACUUM DISPENSING PROCESS) |

| 614 | SECURE A FRAME LID TO THE FRAME BASE AND OVER THE ELECTRONIC DEVICE, SUCH THAT THE GEL AT LEAST PARTIALLY FILLS A CAVITY BETWEEN THE ELECTRONIC DEVICE AND THE FRAME LID, AND SUCH THAT THE CONDUCTIVE SURFACE-MOUNT LEADS EXTEND OUTWARDLY FROM AN OUTER PERIMETER OF THE FRAME IN RESPECTIVE LATERAL DIRECTIONS |

| 616 | PERFORM A CURING PROCESS TO CURE THE GEL |

| 618 | CUT AWAY THE LEADFRAME LEAD CARRIER STRUCTURE |

FIG. 6

ELECTRONIC DEVICE PACKAGE INCLUDING A GEL

RELATED PATENT APPLICATION

This application claims priority to commonly owned U.S. Provisional Patent Application No. 63/400,431 filed Aug. 24, 2022, the entire contents of which are hereby incorporated by reference for all purposes.

TECHNICAL FIELD

The present disclosure relates to electronics packaging, and more particularly, to an electronic device package (e.g., surface-mount device (SMD) package) including a gel.

BACKGROUND

An electronic device packaged for direct mounting to the surface of a printed circuit board (PCB) is commonly referred to as a Surface Mount Device (SMD) package. An SMD package may include various integrated circuit components and/or discrete electronic components. The process for mounting an SMD to a PCB is referred to as Surface Mount Technology (SMT). SMD packaging is often expensive to implement, for example for packaging certain power module devices (SMD power packages).

SMD power packages are typically over-molded using a transfer molding machine. For example, a conventional transfer molded SMD power package may be formed by arranging an electronic device (e.g., substrate with die(s) or other circuitry mounted there) in a reusable mold tool (e.g., a metal mold), dispersing a mold compound in the mold tool to encapsulate the electronic device, and removing the mold-encapsulated electronic device from the reusable mold tool. One drawback of this packaging technique is that a new mold tool may be needed for each different or unique package geometry or design, which may be very expensive.

There is a need for improved and electronics packages and packaging techniques, including SMD packages and packaging techniques.

SUMMARY

Some examples provide an electronic device package, e.g., an SMD package, including an electronic device mounted to a frame and filled with a gel. For example, an SMD package (e.g., an SMD power module package) may include an electronic device including electronic circuitry provided on an electronic device substrate (e.g., one or more IC dies wire bonded to metal lines or other circuitry formed on a ceramic substrate or PCB), and surface-mount leads (e.g., leadframe leads) affixed to the substrate and electrically connected to the electronic circuitry. The electronic device (with the affixed surface-mount leads) may be mounted to the frame, with a gel formed in a cavity between the electronic device and the frame, for example between the electronic device substrate and interior surfaces of the frame. The gel may cover the electronic circuitry of the electronic device, while the surface-mount leads may extend outwardly from an outer perimeter of the gel-filled frame in respective lateral directions.

One aspect provides an electronic device package including a frame, an electronic device mounted to the frame, the electronic device including electronic circuitry provided on an electronic device substrate, surface-mount leads electrically connected to the electronic circuitry and extending laterally and outwardly from an outer perimeter of the frame, and a gel at least partially filling a cavity between the electronic device and the frame, the gel covering the electronic circuitry.

In some examples, the gel fully fills the cavity. In other examples, the gel partially fills the cavity. For example, the gel may fill at least 50% of the cavity, at least 75% of the cavity, at least 90% of the cavity, or at least 95% of the cavity, depending on the particular example.

In some examples, the gel comprises an elastomer gel. For example, the gel may comprise silicone.

In some examples, the electronic device package comprises a surface-mount device (SMD) package.

In some examples, the electronic circuitry comprises at least one integrated circuit (IC) die mounted on the electronic device substrate.

In some examples, a first side of the electronic device substrate is exposed through an opening defined by the frame.

In some examples, a first side of the electronic device substrate is exposed through an opening at a first side of the electronic device package, and the surface-mount leads extend outwardly from the outer perimeter of the frame at a second side of the electronic device package.

In some examples, the surface-mount leads comprise leadframe leads affixed to the electronic device substrate.

In some examples, the frame is formed from a ceramic filled plastic or silicon nitride (SiN).

In some examples, the frame comprises multiple frame components assembled together.

In some examples, the frame comprises a frame base and a frame lid securable to the frame base.

In some examples, the frame base comprises a closed-loop rectangular structure, and the electronic device is mounted in an opening defined by the closed-loop rectangular structure of the frame base.

In some examples, the frame base includes multiple frame base components securable to each other by mechanical connection.

In some examples, the frame lid includes (a) a frame lid plate portion spaced apart from the electronic device and (b) at least one frame lid structural support member projecting perpendicular to the frame lid plate portion, the at least one frame lid structural support member contacting the electronic device to provide structural support for the electronic device package.

In some examples, the electronic device is secured to the frame base, wherein a first side of the electronic device substrate is exposed through an opening defined by the frame base, the frame lid is secured over a second side of the electronic device substrate, and the gel is formed between the second side of the electronic device substrate and the frame lid.

Some examples provide a method of assembling an electronic device package, including (a) affixing surface-mount leads to an electronic device comprising electronic circuitry provided on an electronic device substrate, wherein the surface-mount leads are electrically connected to the electronic circuitry, (b) mounting the electronic device to a frame base, wherein the surface-mount leads extend outwardly from an outer perimeter of the frame base, (c) depositing a gel over the mounted electronic device, and (d) securing a frame lid to the frame base, wherein the gel at least partially fills a cavity between the mounted electronic device and the frame lid.

In some examples, affixing surface-mount leads to the electronic device includes providing a leadframe including leadframe leads extending from a leadframe lead carrier structure, and affixing the leadframe leads to the electronic device substrate of the electronic device.

In some examples, the method includes comprising cutting away the leadframe lead carrier structure after securing the frame lid to the frame base.

In some examples, the method includes mounting the electronic device to the frame base such that a first side of the electronic device substrate is exposed through an opening defined by the frame.

In some examples, mounting the electronic device to a frame base includes securing the electronic device to a first frame base component, and securing a second frame base component to the first frame base component.

In some examples, the method includes using a vacuum dispensing process to fill the cavity with the gel.

In some examples, the method includes performing a curing process to cure the gel.

In some examples, the method includes securing the frame lid to the frame base using mechanical connection elements.

In one example, an electronic device package includes a frame base having a closed-loop rectangular structure defining a frame base opening, an electronic device mounted to the frame base, a frame lid secured to the frame base, and a gel at least partially filling a cavity between the electronic device and the frame lid. The electronic device includes electronic circuitry provided on an electronic device substrate, wherein a first side of the electronic device substrate is exposed through the frame base opening.

In some examples, the frame base includes multiple frame base components securable to each other by mechanical connection.

In some examples, the electronic device package includes surface-mount leads affixed to the electronic device and extending laterally and outwardly from an outer perimeter of the frame base.

BRIEF DESCRIPTION OF THE DRAWINGS

Example aspects of the present disclosure are described below in conjunction with the figures, in which:

FIG. 5 shows a flowchart of an example method for assembling an electronic device package; and FIG. 6 shows a flowchart of another example method for assembling an electronic device package.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
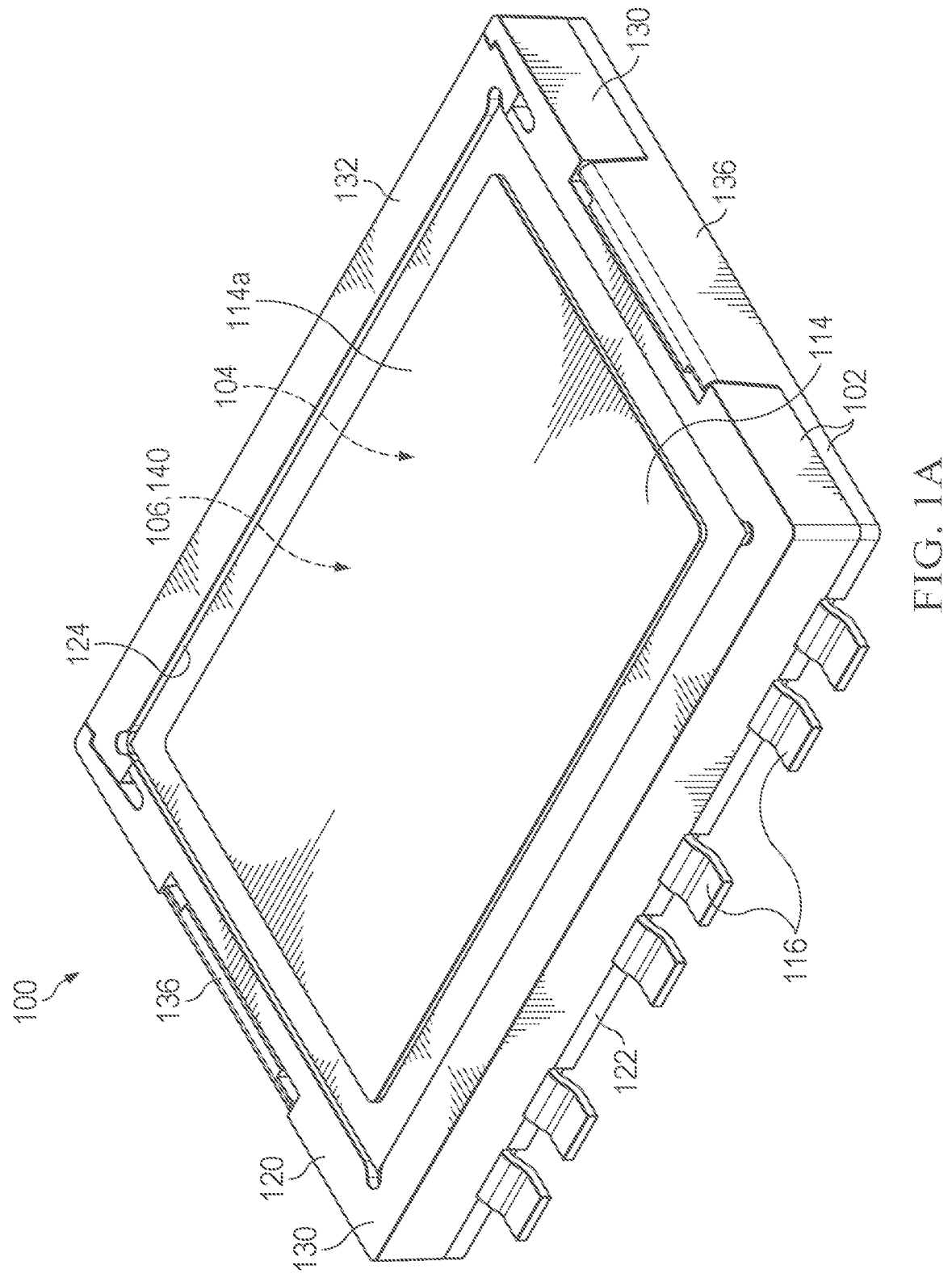
FIGS. 1A-1C show an example electronic device package, e.g., an SMD package, in an assembled state.
Figure 1B:
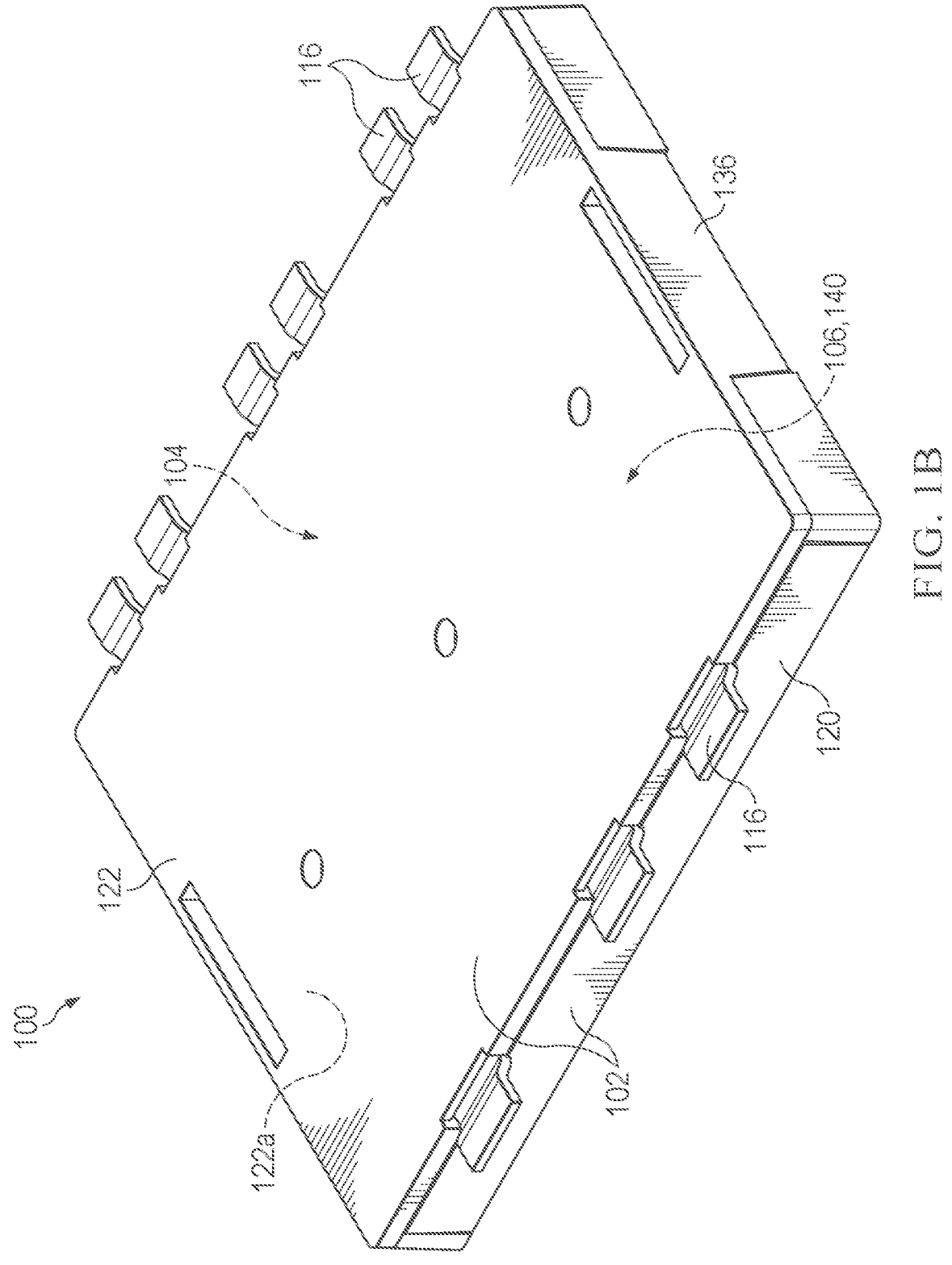
Figure 1C:
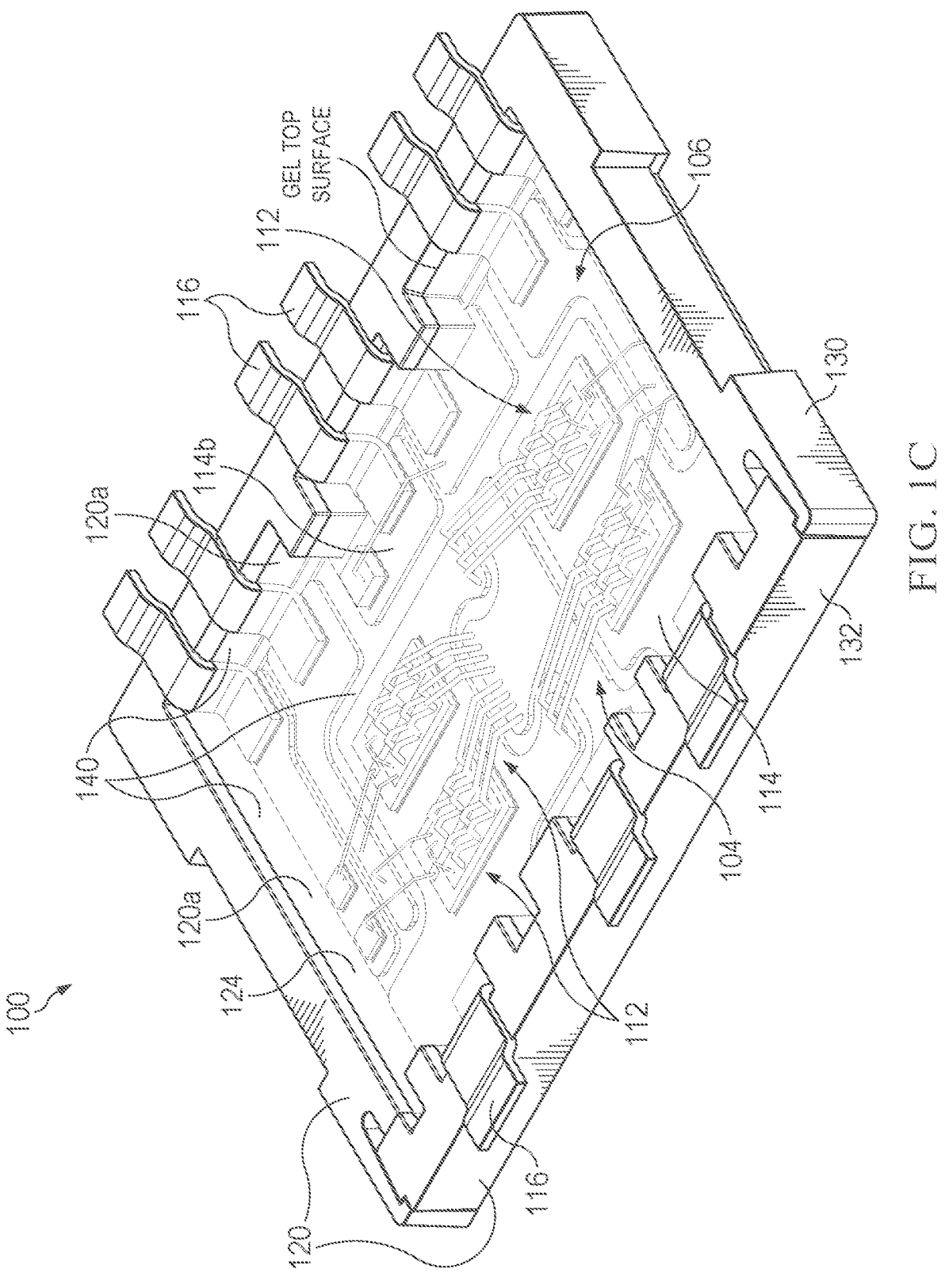

FIGS. 1A-1C show an example electronic device package 100, e.g., an SMD package, in an assembled state, according to one example. FIG. 1A is a three-dimensional view of the electronic device package 100 from above, FIG. 1B is a three-dimensional view of the electronic device package 100 from below, and FIG. 1C is shows the same view as FIG. 1B but with a frame lid 122 omitted for illustration purposes to show interior features of the electronic device package 100.

As shown in FIGS. 1A-1C collectively, the example electronic device package 100 includes a frame 102, an electronic device 104 mounted to the frame 102, surface-mount leads 116, and a gel 106. The electronic device 104 includes electronic circuitry 112 provided on an electronic device substrate 114. The surface-mount leads 116 are electrically connected to the electronic circuitry 112 and extend laterally and outwardly from an outer perimeter of the frame 102. The electronic circuitry 112 may include, for example, one or more dies (chips), field effect transistors (FETs), or other circuitry devices (e.g., capacitors, resistors, inductors, diodes, transistors, or switches), conductive pathways (e.g., traces) formed on the electronic device substrate 114, wire bonds connecting die(s) with conductive pathways or other circuit components. The electronic device substrate 114 may comprise a ceramic substrate, a PCB, or other structure supporting the electronic circuitry 112. In one example, the electronic circuitry 112 comprises the components of a half bridge attached and wire bonded to a ceramic substrate 114.

In the illustrated example, the surface-mount leads 116 comprise leadframe leads affixed to the electronic device substrate 114, e.g., bonded to conductive pathways (e.g., traces) formed on the electronic device substrate 114. As discussed below, leadframe leads may be provided on a leadframe including a leadframe lead carrier structure supporting the leadframe leads; the leadframe leads may be affixed to the electronic device substrate 114 (e.g., by solder or adhesive bonds), and the leadframe lead carrier structure may subsequently be cut away (e.g., after securing the frame lid 122 over the electronic device 104 and gel 106), leaving the leadframe leads affixed to the electronic device substrate 114, e.g., as shown in FIG. 1C. In other examples, the surface-mount leads 116 may comprise pins or other laterally-extending members for surface-mounting the electronic device package 100 to a PCB or other support structure.

The frame 102 at least partially encloses the electronic device 104. For example, as shown in FIGS. 1A-1B, the frame 102 may enclose the electronic device 104, while surface-mount leads 116 may extend outwardly from an outer perimeter of the frame 102. In some examples the frame 102 comprises an assembly of multiple frame components, for example a frame base 120 and a frame lid 122 securable to the frame base 120, wherein the electronic device 104 is secured to the frame base 120 and the frame lid 122 is secured to the frame base 120 and covers the electronic device 104. In some examples, the frame base 120 comprises a closed-loop structure, e.g., a closed-loop rectangular structure, defining a frame opening 124 through which a first side 114a of the electronic device substrate 114 (commonly referred to as the back side of the substrate 114) is exposed. In other examples, the frame base 120 may omit an opening exposing the electronic device substrate 114.

In some examples, the frame base 120 includes multiple frame base components securable to each other, e.g., by mechanical connection and/or adhesive. For example, the frame base 120 may include a first frame base component 130 and a second frame base component 132 securable to the first frame base component 130, e.g., by mechanical connection (e.g., using clip elements formed in the first frame base component 130 and/or second frame base component 132) or by an adhesive. In the illustrated example, the first frame base component 130 has a "C" shape defining three sides of a closed-loop rectangular shape, and the second frame base component 132 defines the fourth side of the closed-loop rectangular shape. In some examples, the multi-component frame base 120 allows the electronic device 104 to be mounted to the frame base 120 after affixing the surface-mount leads 116 to the electronic device substrate 114, by securing the first and second frame base components 130 and 132 around the perimeter of the electronic device substrate 114, e.g., as shown in FIG. 2 and FIGS. 4B, 4C, and 4H.

In other examples, the frame base 120 is formed as a single component, e.g., defining a closed-loop rectangular shape.

The electronic device 104 may be supported in and/or affixed to the frame base 120. In the illustrated example, e.g., as shown in FIG. 1C, the electronic device 104 (including electronic circuitry 112 provided on electronic device substrate 114) may be positioned inside the closed-loop rectangular perimeter of the frame base 120, with surface-mount leads 116 (e.g., leadframe leads) extending laterally outwardly beyond the perimeter of the frame base 120. In some examples, the electronic device 104 may be affixed to the frame base 120, e.g., using an adhesive. In other examples, the electronic device 104 may be supported by, but not affixed to, the frame base 120.

The frame lid 122 may be secured to the frame base 120 in any suitable manner, e.g., by mechanical connection and/or adhesive. In the illustrated example, the frame lid 122 includes clip elements 136 (also shown in FIG. 3, discussed below) that engage with the frame base 120 to mechanically secure the frame lid 122 to the frame base 120.

The gel 106 at least partially fills a cavity 140 defined between the electronic device 104 and at least by the frame 102, and covers the electronic circuitry 112 of the electronic device 104. In the assembled state of the electronic device package 100, as more clearly shown in FIG. 4H discussed below, the cavity 140 may be defined between a second side 114b of the electronic device substrate 114, an interior side 122a of the frame lid 122, and interior sides 120a of the frame base 120. In some examples, the cavity 140 may be a fully enclosed cavity. In other examples, the cavity 140 may include one or more openings.

In some examples, the gel 106 fully fills the cavity 140. In other examples, the gel 106 partially fills the cavity 140. For example, in some examples the gel 106 fills at least 50% of the cavity 140, at least 75% of the cavity 140, at least 90% of the cavity 140, or at least 95% of the cavity 140, depending on the particular example or implementation. References herein to the amount of the cavity 140 filled by the gel 106 (e.g., fully filled, at least 50% filled, at least 75% filled, at least 90% filled, or at least 95% filled) do not account for any internal voids in the gel 106. In some examples, internal voids have a total volume of less than 50%, or less than 10%, or less than 1% of the total volume of the gel 106 in the assembled electronic device package 100.

In some examples, internal voids and/or other non-filled portions of the cavity 140 may correlate with a reduced lifespan of certain electronic circuitry 112 in the electronic device package 100. Accordingly, in some examples, the electronic device package 100 is assembled such that gel 106 fully fills the cavity 140 and includes internal voids having a total volume of less than 1% of the total volume of the gel 106. In some examples, internal voids in the gel 106 may have a bubble size less than or equal to 20 μm.

In some examples, the gel 106 comprises an elastomer or elastomeric material, for example a silicone gel or a silicone-based gel. In some examples, gel 106 may comprise any of the following:

(A) KE1066A/B silicone from Shin-Etsu Chemical Company, Tokyo, Japan;

(B) Sylgard® 3-6636 Silicon Dielectric Gel from Dow Corning Corporation, Midland, Michigan;

(C) Sylgard® 3-6635 Silicon Dielectric Gel from Dow Corning Corporation, Midland, Michigan;

(D) EG-3000 Thixotropic Gel from Dow Corning Corporation, Midland, Michigan; or (E) CV-8251 Controlled Volatility Silicone Gel from NuSil Technology LLC, Irving, Texas.

In some examples, the gel 106 comprises a multi-component gel, e.g., including two components mixed together in liquid form (prior to depositing in the cavity 140), and then subsequently cured (e.g., after securing the frame lid 122 to the frame base 120, or otherwise after depositing in the cavity 140) to convert the liquid mixture to a more viscous, gel-like substance. Example gels A, B, D, and E listed above comprise two-component gels.

In other examples, the gel 106 may comprise a single component, e.g., example gel C listed above.

In some examples, the gel 106 may exhibit certain material properties. For example, the gel 106 may exhibit any one or more of the following properties:

(a) viscosity of uncured gel 106 (for a multi-component gel, after mixing the components but before curing the mixture), in the range of 500-3200 cP (or mPa·s);

(b) hardness of cured gel 106 in the range of 50-130 g, in some examples in the range of 70-110 g;

(c) consistency of cured gel 106, using the ASTM D5 penetration test, in the range of 3-10 mm; and/or (d) dielectric strength of cured gel 106 in the range of 10-30 kV/mm, in some examples in the range of 15-25.

In some examples, the consistency of the cured gel 106 (e.g., having a consistency providing a penetration of 3-10 mm using the ASTM D5 penetration test, as listed above) allows bond wires and/or other relatively fragile components of the electronic device 104 to travel through the gel 106, e.g., during thermal expansion or contraction of various components of the electronic device package 100, without damaging the bond wires and/or other fragile or delicate components.

Figure 2:
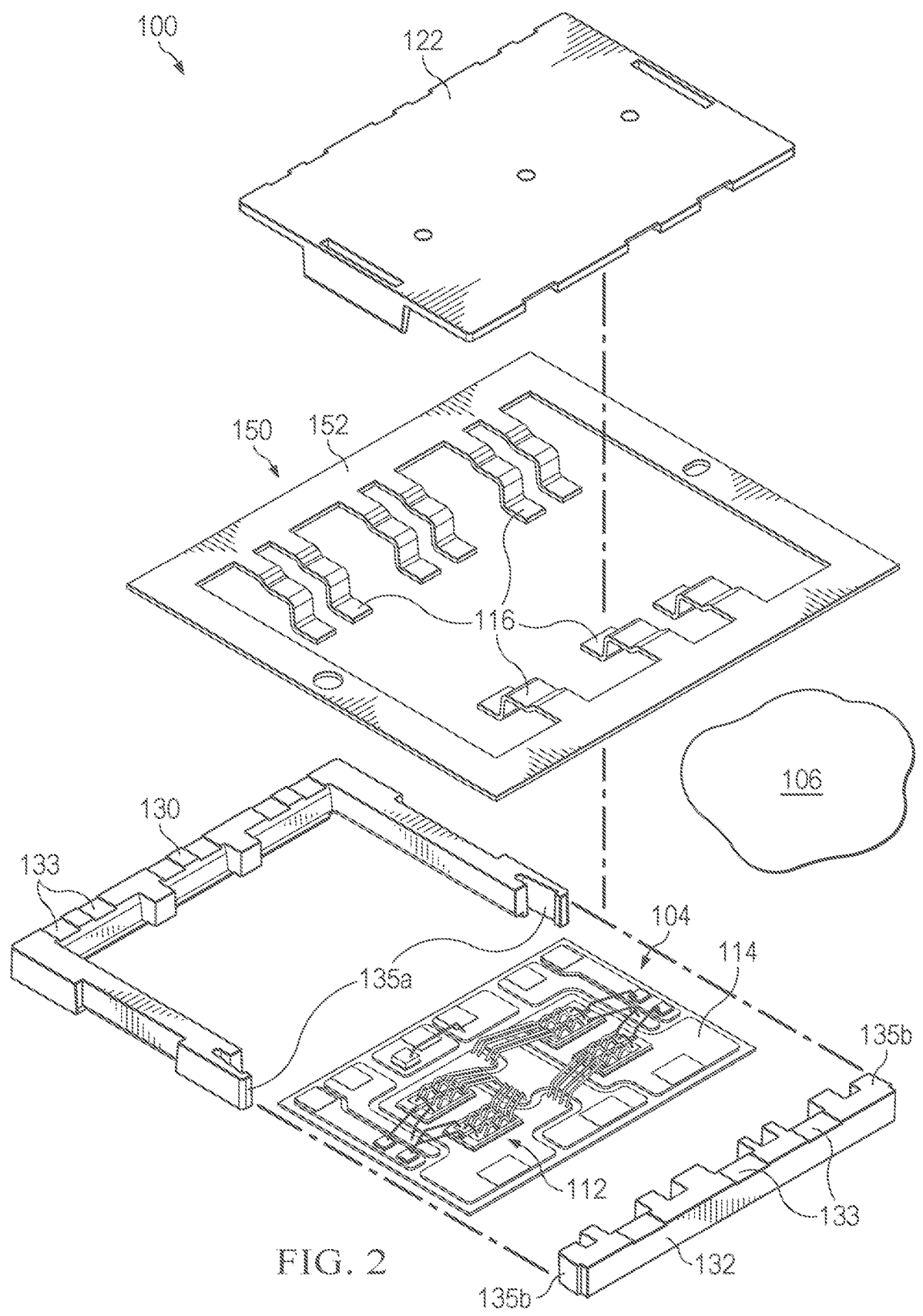
FIG. 2 is an exploded drawing of the example electronic device package shown in FIGS. 1A-1C, prior to assembly.

FIG. 2 is an exploded drawing of the example electronic device package 100 shown in FIGS. 1A-1C, prior to assembly (i.e., in a pre-assembled state). As shown, the pre-assembled electronic device package 100 includes (a) the electronic device 104 including electronic circuitry 112 provided on the electronic device substrate 114, (b) a leadframe 150 including the leadframe leads 116 extending from a leadframe lead carrier structure 152 carrying the leadframe leads 116, (c) the first frame base component 130 and the second frame base component 132 (which may be connected to define the frame base 120, as discussed above), (d) the frame lid 122, and (3) the gel 106.

As discussed below with reference to FIGS. 4A and 4B, the leadframe leads 116 may be affixed to the electronic device substrate 114 (e.g., by solder or adhesive bonds), and the leadframe lead carrier structure 152 may subsequently be cut away (e.g., after securing the frame lid 122 over the electronic device 104 and gel 106), leaving the leadframe leads 116 affixed to the electronic device substrate 114.

As shown in FIG. 2, the first frame base component 130 and/or the second frame base component 132 may include recesses or slots 133 shaped to receive respective leadframe leads 116 during assembly of the electronic device package 100. The first frame base component 130 and second frame base component 132 may also include clip elements 135*a* and 135*b*, respectively, to mechanically secure the second frame base component 132 to the first frame base component 130, e.g., as discussed below with reference to FIG. 4D.

In some examples, the first frame base component 130, the second frame base component 132, and/or the frame lid 122 may be formed using a rapid prototype process or additive printing process (e.g., a 3D additive printing process) from a ceramic-filled plastic resin (e.g., Somos® PerFORM from Koninklijke DSM N.V. based in Heerlen, Netherlands (also known as DSM or Royal DSM)), silicon nitride, or other non-conductive material. Forming some or all of the frame components (e.g., first frame base component 130, the second frame base component 132, and/or the frame lid 122) using a rapid prototype process or additive printing process (e.g., 3D printing) may provide a substantial reduction in manufacturing costs (e.g., by reducing or eliminating non-recurring engineering (NRE) costs), as compared with conventional processes that use an expensive reusable mold tool to form a mold encapsulation on an electronic device, e.g., as discussed in the Background section.

In other examples, the first frame base component 130, the second frame base component 132, and/or the frame lid 122 may be formed by injection molding, casting, or other suitable manufacturing process. In some examples, the first frame base component 130, the second frame base component 132, and/or the frame lid 122 may be formed using a simpler and less expensive mold tool as compared with conventional processes.

Figure 3:
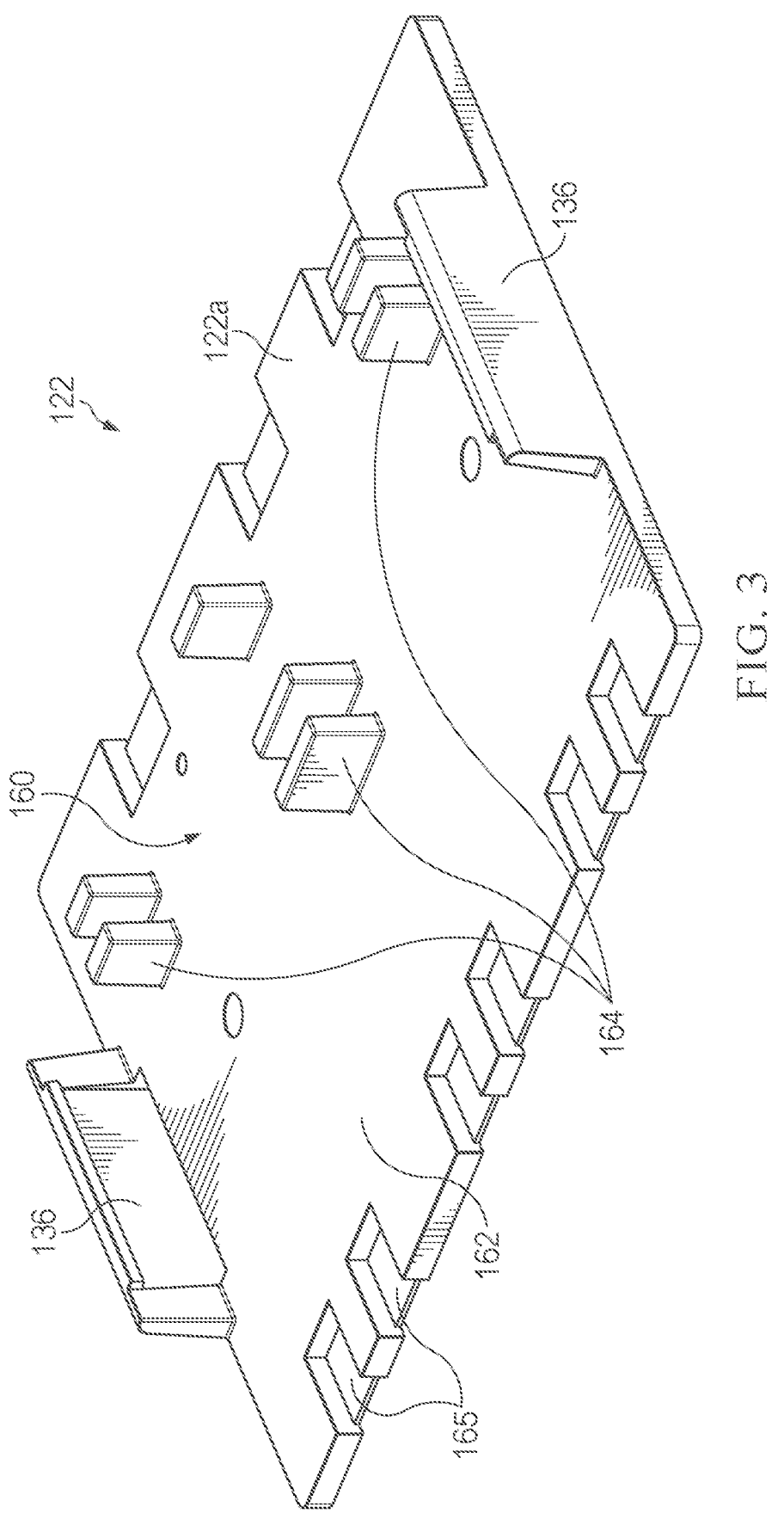
FIG. 3 is a three-dimensional view of a frame lid according to one example.

FIG. 3 is a three-dimensional view of the frame lid 122 according to one example. In particular, FIG. 3 shows an interior side 160 of the frame lid 122, which interior side 160 faces the electronic device 104 in the assembled state of the electronic device package 100 (e.g., shown in FIG. 4H discussed below). The example frame lid 122 includes a frame lid plate portion 162, a number of frame lid structural support members 164 projecting from the interior side 122*a* in a direction perpendicular to the frame lid plate portion 162, and clip elements 136 extending from the frame lid plate portion 162. The frame lid plate portion 162 may include recesses or slots 165 shaped to receive respective leadframe leads 116.

In the assembled state of the electronic device package 100, the frame lid plate portion 162 is spaced apart from the electronic device 104 (with gel 106 between the frame lid plate portion 162 and electronic device 104), and the frame lid structural support members 164 may contact the electronic device 104 to provide additional structural support for the electronic device package 100, e.g., to support the weight of structure(s) mounted on the assembled electronic device package 100 (e.g., a heat sink (not shown) mounted on the exposed first side 114*a* (see FIG. 1A) of the electronic device substrate 114), or otherwise resist deformation of the electronic device package 100 (e.g., deformation of the electronic device substrate 114 and/or the frame lid 122).

Figure 4A:
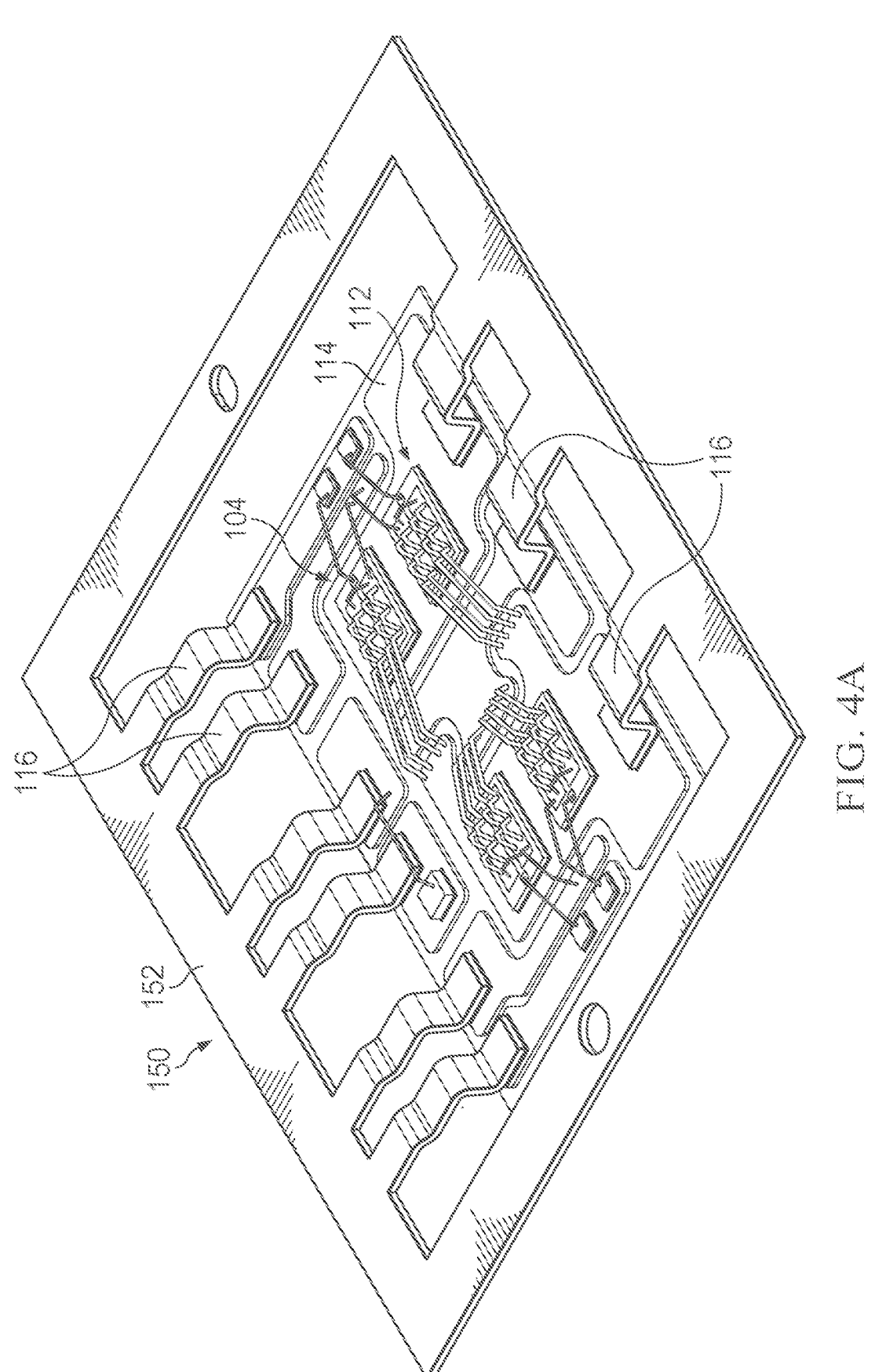
FIGS. 4A-4H show an example process for forming (assembling) the example electronic device package shown in FIGS. 1A-1C.

FIGS. 4A-4H show an example process for forming (assembling) the example electronic device package 100 shown in FIGS. 1A-1C. FIG. 4A is a three-dimensional bottom view showing the leadframe 150 (including leadframe lead carrier structure 152 and leadframe leads 116 extending therefrom) affixed to the electronic device 104 (including electronic circuitry 112 provided on the electronic device substrate 114). In particular, the leadframe leads 116 may be affixed to the electronic device substrate 114, e.g., by solder or adhesive bonding.

Figure 4B:
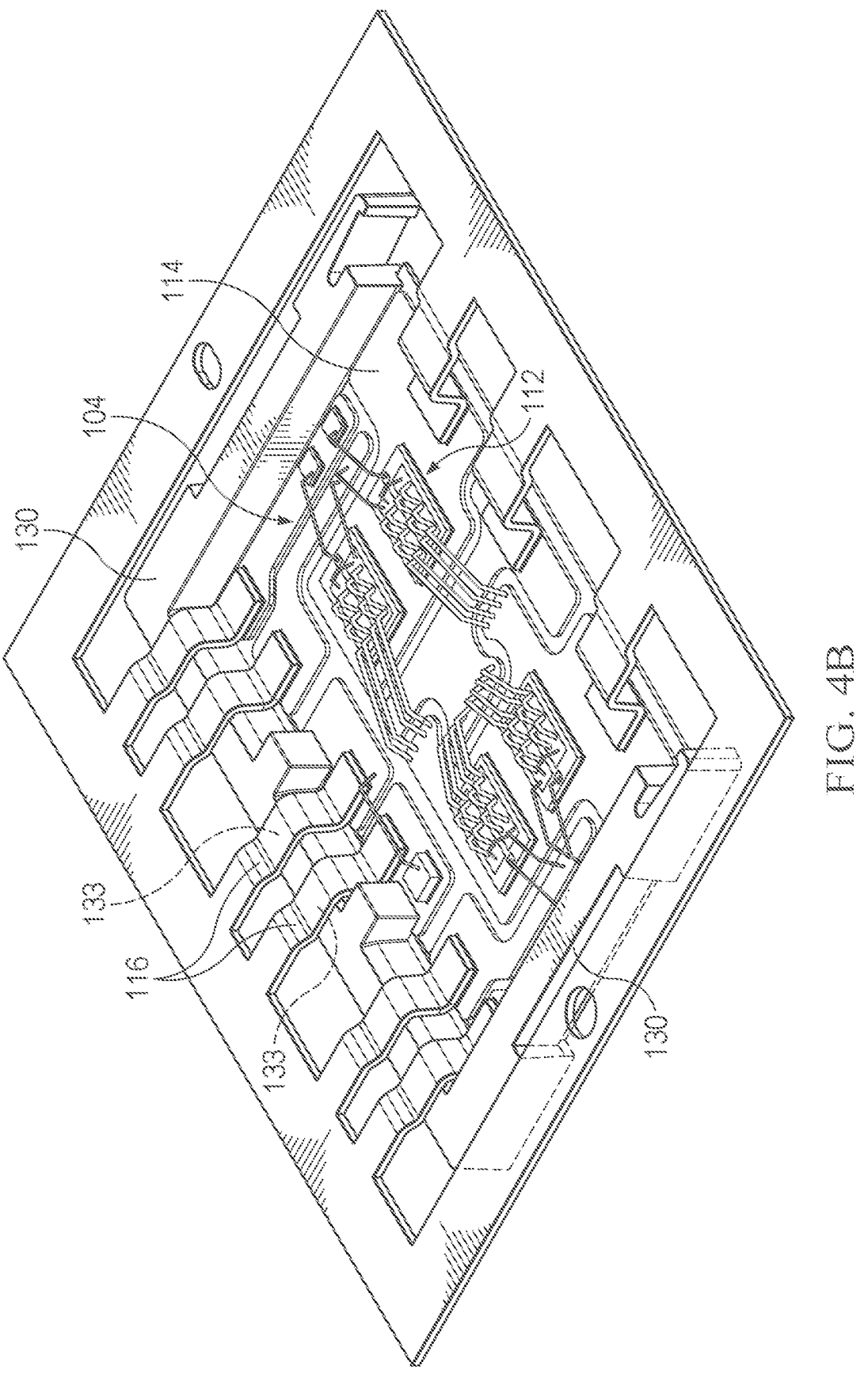
Figure 4C:
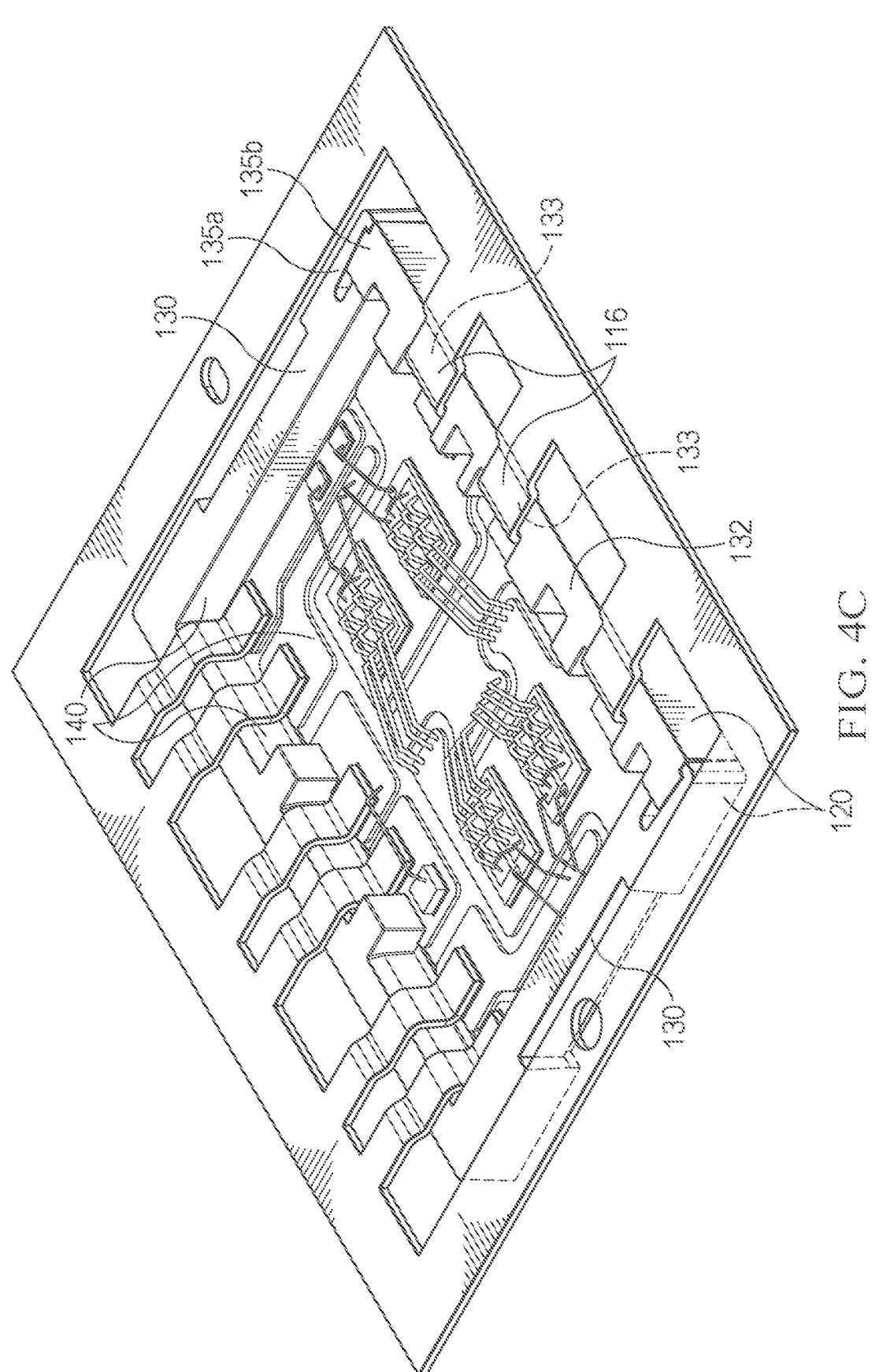

The electronic device 104 may be mounted to the frame base 120 as shown in FIGS. 4B and 4C. As shown in FIG. 4B (three-dimensional bottom view), the electronic device 104 is affixed to the first frame base component 130 having a three-sided "C" shape. For example, lateral edges of the electronic device substrate 114 and/or leadframe leads 116 may be affixed to the first frame base component 130 using a silicone-based adhesive (e.g., room-temperature-vulcanizing (RTV) silicone) or other adhesive. As shown, the leadframe leads 116 may be received in respective recesses or slots 133 defined in the first frame base component 130.

As shown in FIG. 4C (three-dimensional bottom view), the second frame base component 132 may be secured to the first frame base component 130 by engaging the clip elements 135*a* with corresponding clip elements 135*b*, to define the frame base 120 having a closed-loop rectangular shape. The second frame base component 132 may also (optionally) be secured to the electronic device 104. For example, a lateral edge of the electronic device substrate 114 and/or leadframe leads 116 may be affixed to the second frame base component 132 using a silicone-based adhesive (e.g., RTV silicone) or other adhesive. As shown, the leadframe leads 116 may be received in respective recesses or slots 133 defined in the second frame base component 132.

As discussed above, in other examples the frame base 120 may be formed as a single-piece component, and the electronic device 104 may be mounted to the frame base 120 in a single step.

Figure 4D:
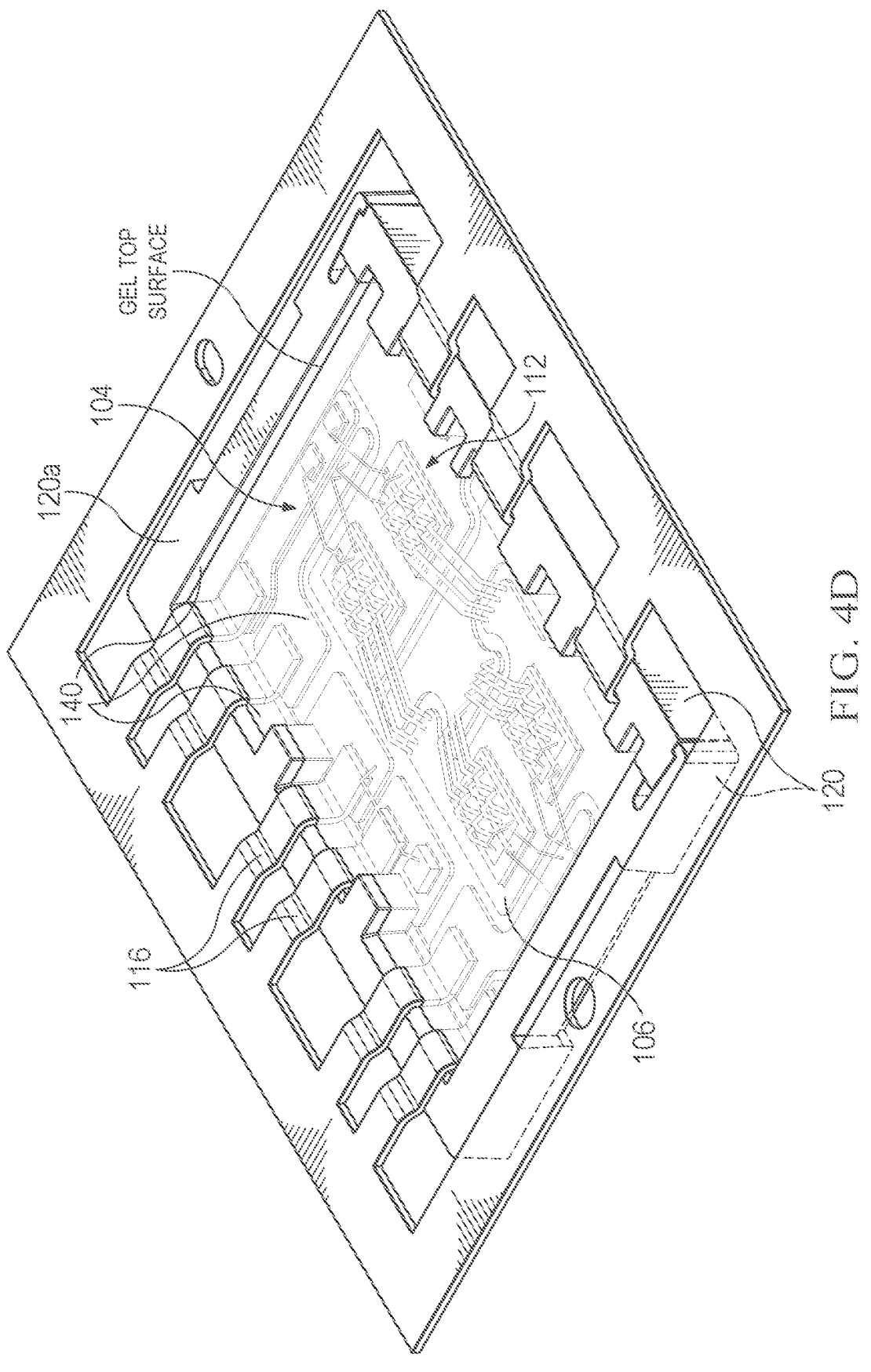

The electronic device 104 and the assembled frame base 120 partially define the cavity 140 for receiving the gel 106. As shown in FIG. 4D (three-dimensional bottom view), the cavity 140 is partially or completely filled with the gel 106, which gel 106 covers at least the electronic circuitry 112 of the electronic device 104. As discussed above, the gel 106 may comprise an elastomeric material, for example a silicone gel or a silicone-based gel. In some examples, the gel 106 may be deposited in the cavity 140 in liquid form, using a vacuum dispensing process, which may reduce or eliminate voids in the gel 106. In other examples, the gel 106 may be deposited in the cavity 140 in liquid form using a nozzle-based injection process or any other suitable deposition process.

In some examples, the deposited gel 106 completely fills a full height of the cavity 140, e.g., up to a top surface 120*a* of the frame base 120. In other examples, e.g., as shown in FIG. 4D, the deposited gel 106 fills only a partial height of the cavity 140, e.g., below the top surface 120*a* of the frame base 120, to accommodate the volume of frame lid structural support members 164 projecting down into the cavity 140 upon securing of the frame lid 122 to the frame base 120, as discussed below.

Figure 4E:
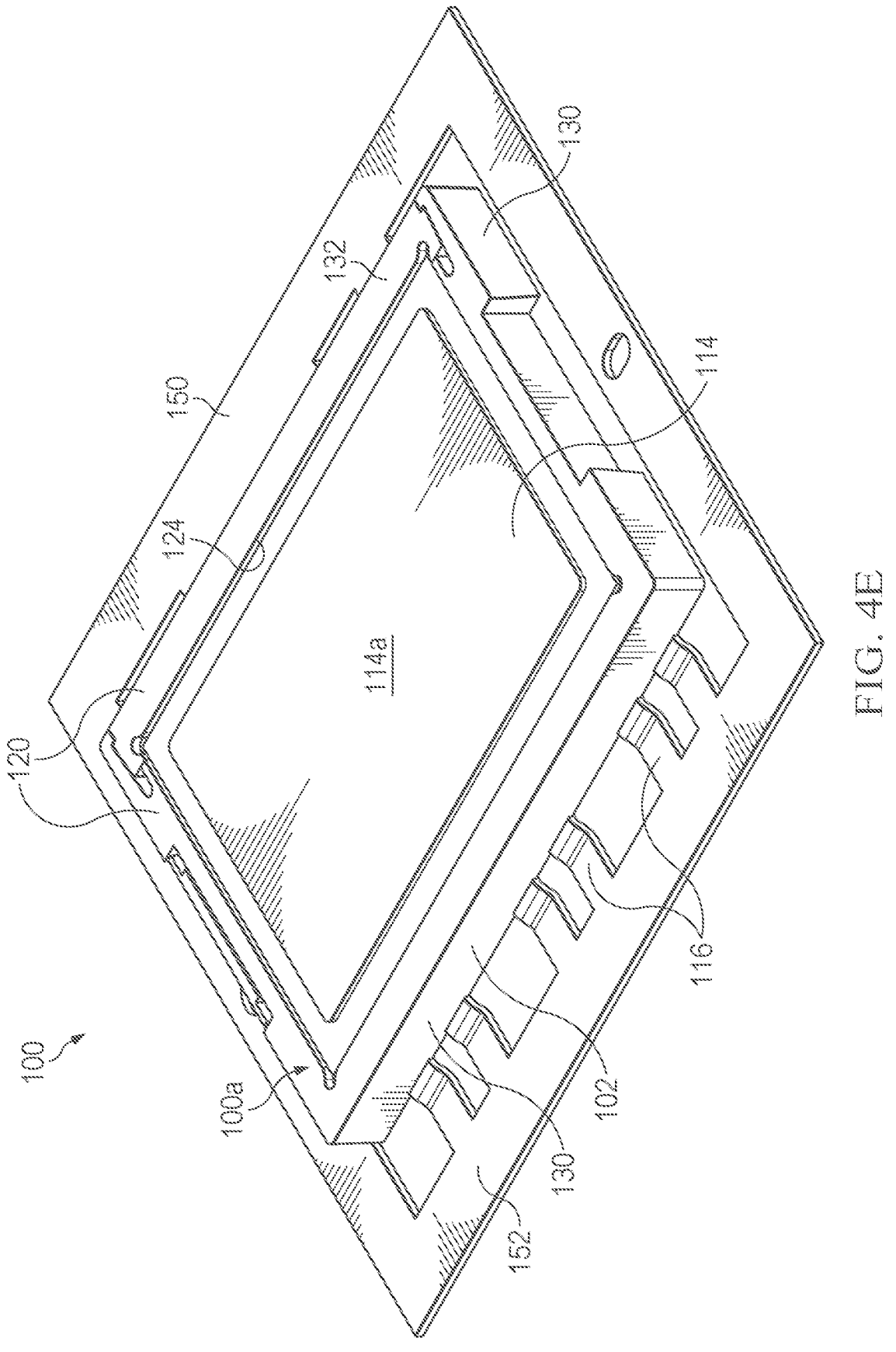

As shown in FIG. 4E (three-dimensional top view), the first side 114*a* of the electronic device substrate 114 may be exposed through the frame opening 124 defined by the closed-loop rectangular structure of the frame base 120, at a first side 100*a* of the electronic device package 100. In some examples, a heat sink or other device may be mounted to the exposed first side 114*a* of the electronic device substrate 114.

Figure 4F:

As shown in FIG. 4F (three-dimensional bottom view), the frame lid 122 is secured to the frame base 120 using clip elements 136 (also shown in FIG. 3, discussed above) that engage with the frame base 120. In some examples, the frame lid 122 may be further secured to the frame base 120 using an adhesive. The secured frame lid 122 closes the cavity 140. The closed cavity 140 may be fully enclosed or may include at least one opening, e.g., to allow an outflow of gas or excess gel 106 (in liquid form) during the securing of the frame lid 122. In some examples, the gel 106 may completely fill the volume of the cavity 140 after the frame lid 122 is secured, which may be referred to as the closed cavity 140. In an example in which the deposited gel filling 106 fills only a partial height of the cavity 140 (e.g., below the top surface 120a of the frame base 120) prior to assembling the frame lid 122 (e.g., as shown in FIG. 4D), the frame lid structural support members 164 may displace a corresponding volume of the gel 106 such that gel 106 fully fills the closed cavity 140. As discussed above with reference to FIGS. 1A-1C, in other examples, the gel 106 partially fills the closed cavity 140; for example, in some examples the gel 106 fills at least 50%, at least 75%, at least 90%, or at least 95% of the closed cavity 140.

Figure 4G:
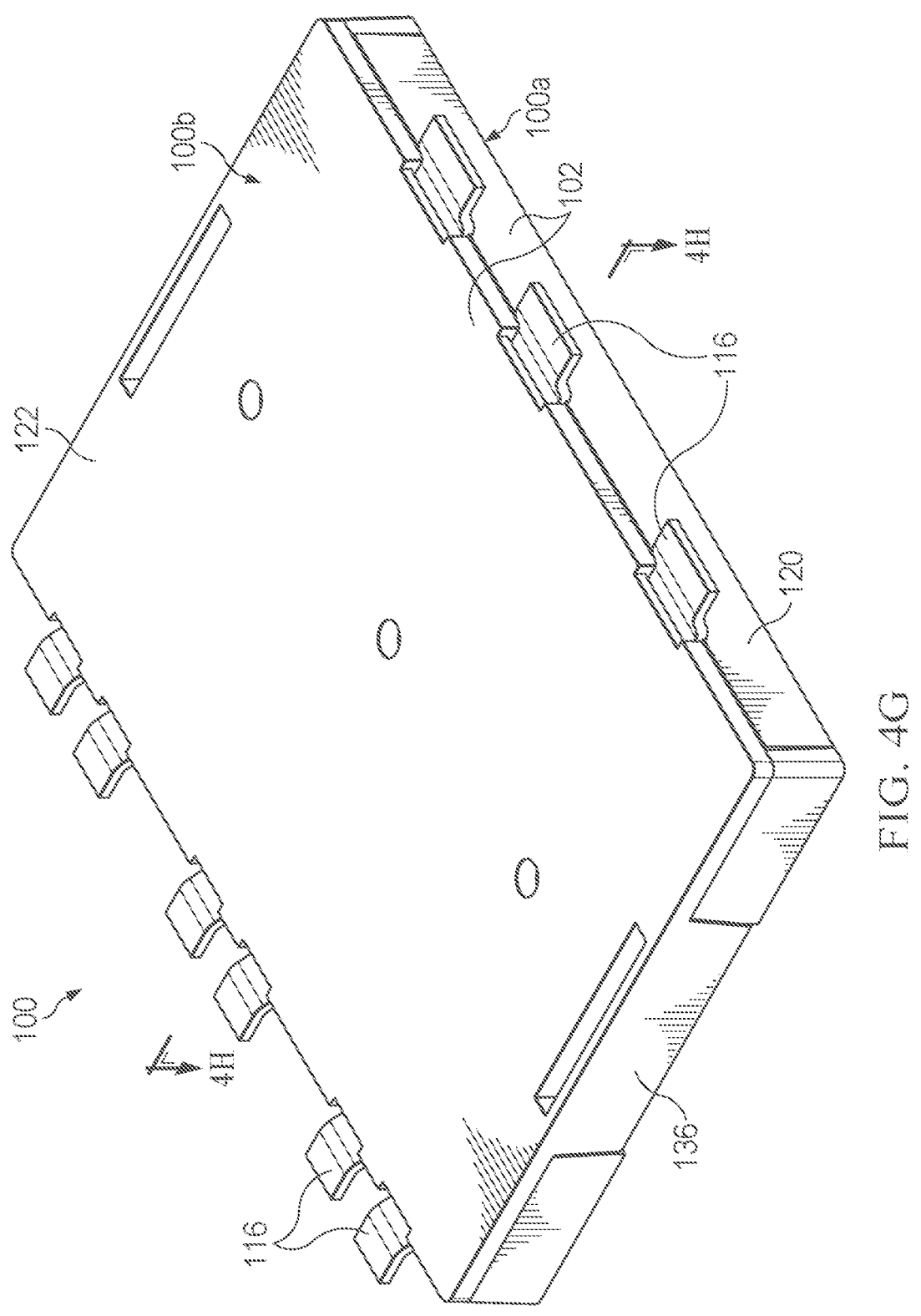

As shown in FIG. 4G, the leadframe lead carrier structure 152 may be cut away and removed, leaving the leadframe leads 116 affixed to the electronic device substrate 114. In other examples, the leadframe lead carrier structure 152 may be cut away at other points in the process, e.g., prior to mounting the electronic device 104 to the frame 102, or after mounting the electronic device 104 to the frame 102 but prior to depositing the gel 106.

In some examples the gel 106 may be cured to convert the gel from a liquid state to a semi-solid gel state. For example, a curing process may be performed in a temperature range of 100-150° C. for a duration in the range of 45-120 minutes. The cured gel 106 may exhibit any of the properties listed above. For example, in some examples the cured gel 106 may exhibit (a) a hardness in the range of 50-130 g (for example in the range of 70-110 g) and/or (b) a consistency characterized by 3-10 mm penetration using the ASTM D5 penetration test.

Figure 4H:
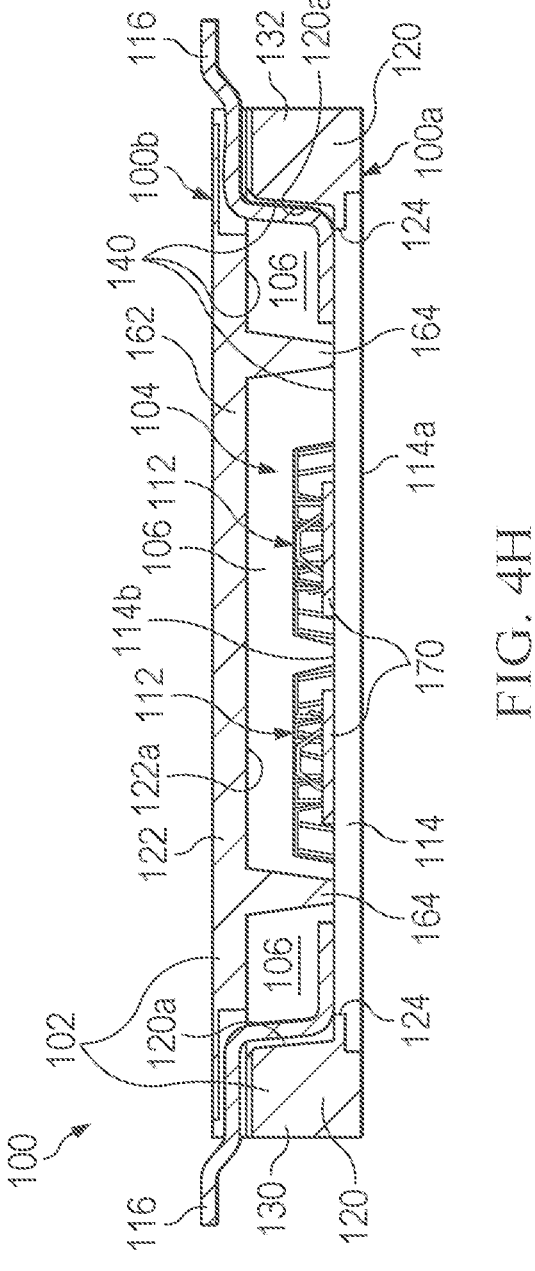

FIG. 4H shows a cross-sectional side view through plane 4H-4H shown in FIG. 4G. The cross-sectional view shows elements of (a) frame 102, including the first frame base component 130 and second frame base component 132 (defining the frame base 120) and the frame lid 122, (b) electronic device 104, (c) leadframe leads 116 affixed to the electronic device 104, and (d) gel 106 in the cavity 140. The electronic device 104 includes electronic circuitry 112 (e.g., dies 170) provided on the electronic device substrate 114. The leadframe leads 116 are affixed to electronic device substrate 114 and extend laterally outwardly from the frame 102 at a bottom side 100b of the assembled electronic device package 100, opposite the top side 100a at which the first side 114a of the electronic device substrate 114 is exposed through the frame opening 124.

FIG. 4H also shows example frame lid structural support members 164 projecting downward from the frame lid plate portion 162 and in contact with (e.g., resting on) the top surface of the electronic device substrate 114, providing additional structural support for the electronic device package 100.

As shown, the gel 106 fills the cavity 140 defined between the second side 114b of the electronic device substrate 114, the interior side 122a of the frame lid 122, and interior sides 120a of the frame base 120, which cavity 140 may be fully enclosed of may include one or more openings.

FIG. 5 shows a flowchart of an example method 500 for assembling an electronic device package, according to one example. At 502, surface-mount leads are affixed to an electronic device comprising an electronic device substrate and electronic circuitry provided on the electronic device substrate, wherein the affixed surface-mount leads are electrically connected to the electronic circuitry. At 504, the electronic device (with the affixed surface-mount leads) is mounted to a frame base. At 506, a gel is deposited on the mounted electronic device, e.g., using a vacuum dispensing process, with the deposited gel covering the electronic circuitry. At 508, a frame lid is secured to the frame base and over the electronic device, such that the gel at least partially fills a cavity between the electronic device substrate and the frame lid, and such that the surface-mount leads extend outwardly from an outer perimeter of the frame in respective lateral directions.

In some examples, the surface-mount leads comprise leadframe leads carried by a leadframe lead carrier structure, wherein the leadframe lead carrier structure may be cut away at some point after affixing the leadframe leads to the electronic device (e.g., after securing the frame lid to the frame base, or after mounting the electronic device to the frame base but before depositing the gel).

FIG. 6 shows a flowchart of another example method 600 for assembling an electronic device package, according to one example. At 602, frame components, e.g., a first frame base component, a second frame base component, and a frame lid, are formed using a rapid prototype process or additive manufacturing process (e.g., a 3D printing process). At 604, a leadframe is provided, including leadframe leads extending from a leadframe lead carrier structure. At 606, the leadframe leads are affixed to an electronic device, for example affixed to the electronic device substrate of the electronic device. It should be understood that the order in which 602-606 are performed is arbitrary; that is, the frame components may be formed (602) before or after affixing the leadframe leads to the electronic device (606). At 608, the first frame base component is secured to the electronic device, e.g., using an adhesive. At 610, the second frame base is secured to the first frame base component, e.g., using clip elements, and (optionally) affixed to the secured to the electronic device, e.g., using an adhesive.

At 612, a gel is deposited on the mounted electronic device (e.g., using a vacuum dispensing process), the deposited gel covering electronic circuitry of the electronic device. At 614, a frame lid is secured to the frame base and over the electronic device, such that the gel at least partially fills a cavity defined between the electronic device substrate and the frame lid, and such that the conductive surface-mount leads extend outwardly from an outer perimeter of the frame in respective lateral directions. At 616, a curing process is performed to cure the deposited gel, e.g., to convert the gel from a liquid state to a semi-solid gel state, as discussed above. At 618, the leadframe lead carrier structure may be cut away and removed, leaving the leadframe leads extending outwardly from the outer perimeter of the frame.

The invention claimed is:

1. A method of assembling an electronic device package, the method comprising:

positioning a leadframe proximate an electronic device comprising electronic circuitry provided on an electronic device substrate, the leadframe including surface-mount leads extending from a leadframe lead carrier structure;

affixing the surface-mount leads of the leadframe to the electronic device, wherein the surface-mount leads are electrically connected to the electronic circuitry;

mounting the electronic device to a frame base defining a perimeter extending around the electronic device, wherein the surface-mount leads affixed to the electronic device extend outwardly from inside the perimeter of the frame base to outside the perimeter of the frame base;

depositing a gel on the mounted electronic device; and securing a frame lid to the frame base, wherein the gel at least partially fills a cavity between the mounted electronic device and the frame lid.

2. The method of claim 1, comprising cutting away the leadframe lead carrier structure after securing the frame lid to the frame base.

3. The method of claim 1, comprising mounting the electronic device to the frame base such that a first side of the electronic device substrate is exposed through an opening defined by the frame.

4. The method of claim 1, wherein mounting the electronic device to the frame base comprises:

securing the electronic device to a first frame base component; and securing a second frame base component to the first frame base component.

5. The method of claim 1, comprising performing a curing process to cure the gel in the cavity.

6. The method of claim 1, wherein the gel fully fills the cavity between the mounted electronic device and the frame lid.

7. The method of claim 1, wherein the gel comprises an elastomer gel.

8. The method of claim 1, wherein the gel comprises silicone.

9. The method of claim 1, wherein the electronic device package comprises a surface-mount device (SMD) package.

10. The method of claim 1, wherein:

the frame base comprises a closed-loop rectangular structure; and the electronic device is mounted in an opening defined by the closed-loop rectangular structure of the frame base.

11. The method of claim 1, comprising mounting the electronic device to the frame base such that a first side of the electronic device substrate is exposed through an opening defined by the frame:

wherein the frame lid is secured over a second side of the electronic device substrate; and wherein the cavity at least partially filled by the gel is defined between the second side of the electronic device substrate and the frame lid.

12. A method of assembling an electronic device package, the method comprising:

positioning a leadframe proximate an electronic device comprising electronic circuitry provided on an electronic device substrate, the leadframe including surface-mount leads extending from a leadframe lead carrier structure;

affixing the surface-mount leads of the leadframe to the electronic device, wherein the surface-mount leads of the leadframe are electrically connected to the electronic circuitry;

mounting the electronic device to a frame base defining a perimeter extending around the electronic device, wherein the surface-mount leads affixed to the electronic device extend outwardly from inside the perimeter of the frame base to outside the perimeter of the frame base, and wherein the electronic device and frame base define an open-sided cavity;

at least partially filling the open-sided cavity with a gel, such that the gel at least partially covers the electronic circuitry of the electronic device; and securing a frame lid to the frame base to close the open-sided cavity and thereby enclose the gel in the closed cavity.

13. The method of claim 12, wherein:

the method includes cutting away the leadframe lead carrier structure after securing the frame lid to the frame base.

14. The method of claim 12, comprising mounting the electronic device to the frame base such that a first side of the electronic device substrate is exposed through an opening defined by the frame;

wherein the frame lid is secured over a second side of the electronic device substrate; and wherein the cavity at least partially filled by the gel is defined between the second side of the electronic device substrate and the frame lid.

15. The method of claim 12, wherein mounting the electronic device to the frame base comprises:

securing the electronic device to a first frame base component; and securing a second frame base component to the first frame base component.

16. The method of claim 12, comprising performing a curing process to cure the gel in the cavity.

17. The method of claim 12, wherein:

the frame base comprises a closed-loop rectangular structure; and the electronic device is mounted in an opening defined by the closed-loop rectangular structure of the frame base.

* * * * *